(12) United States Patent
Melanson et al.

(10) Patent No.: US 6,854,084 B2
(45) Date of Patent: Feb. 8, 2005

(54) PARTITIONED RANDOM ACCESS MEMORY

(75) Inventors: Ronald J. Melanson, Woodside, CA (US); Greg Papadopoulos, Los Altos, CA (US); Renu Raman, Los Altos, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 409 days.

(21) Appl. No.: 09/904,884

(22) Filed: Jul. 12, 2001

(65) Prior Publication Data

US 2002/0046383 A1 Apr. 18, 2002

Related U.S. Application Data

(60) Provisional application No. 60/218,346, filed on Jul. 14, 2000.

(51) Int. Cl.$^7$ ................................................ G11C 29/00
(52) U.S. Cl. ........................................................ 714/773
(58) Field of Search ................................ 714/6, 52–54, 714/763–773, 718; 365/200, 230.03

(56) References Cited

U.S. PATENT DOCUMENTS

| | | | |
|---|---|---|---|
| 5,611,042 A | * | 3/1997 | Lordi .............................. 714/6 |
| 5,916,314 A | | 6/1999 | Berg et al. ...................... 714/6 |
| 6,237,124 B1 | * | 5/2001 | Plants ........................ 714/763 |

OTHER PUBLICATIONS

International Search Report, dated May 28, 2002 (7 pages).
700 IBM Technical Disclosure Bulletin, vol. 31, No. 3, Aug. 1988, Armonk, NY (4 pages).

P.R. Turgeon, et al., "Two Approaches to Array Fault Tolerance in the IBM Enterprise System/9000 Type 9121 Processor", IBM Journal of Research and Development, vol. 35, No. 3, May 1991, Armonk, NY (7 pages).

* cited by examiner

*Primary Examiner*—Shelly A Chase
(74) *Attorney, Agent, or Firm*—Osha & May L.L.P.

(57) ABSTRACT

A random access memory includes a first memory bank, a second memory bank, an error checking circuit operatively connected to receive data read from the first memory bank, and a multiplexer operatively connected to input data read from both the first memory bank and the second memory bank, wherein input selection of the multiplexer is controlled by an output of the error checking circuit. A method for reducing errors in a memory system includes writing data into first and second memory banks of the memory system in parallel, reading data from a desired location of the first memory bank, checking the data read from the first memory bank for errors, if no errors are present, outputting the data read from the first memory bank to a bus, and if the data read from the first memory bank contains errors, outputting data read from a parallel location in the second memory bank to the bus. A method for reducing errors in a memory system comprises writing data into first and second memory banks of the memory system in parallel, reading data from a desired location of the first memory bank, checking the data read from the first memory bank for errors, if no errors are present, outputting the data read from the first memory bank to a bus, and if the data read from the first memory bank contains errors, outputting data read from a parallel location in the second memory bank to the bus.

16 Claims, 2 Drawing Sheets

PARTITIONED RANDOM ACCESS MEMORY

CROSS-REFERENCE TO RELATED APPLICATIONS

This application claims benefit of provisional application Ser. No. 60/218,346, filed on Jul. 14, 2000.

FIELD OF INVENTION

The invention relates to error avoidance in random access memory.

BACKGROUND

Referring to FIG. 1, a typical computer system includes a microprocessor (10) having, among other things, a CPU (12), a load/store unit (14), and an on-board cache memory (16). The microprocessor (10) is connected to an external cache memory (17) and a main memory (18) that both hold data and program instructions to be executed by the microprocessor (10). Internally, execution of program instructions is carried out by the CPU (12). Data needed by the CPU (12) to carry out an instruction are fetched by the load/store unit (14) and loaded into internal registers (15) of the CPU (12). A memory queue (not shown) maintains a list of outstanding memory requests. The load/store unit adds requests into the memory queue and also loads registers with values from the memory queue. Upon command from the CPU (12), the load/store unit (14) searches for the data first in the fast on-board cache (16), then in external cache memory (level 2 cache) (17), and final in the slow main memory (18).

Typically, the level two cache (17) is constructed using static random access memory (SRAM), while the main memory is constructed using dynamic random access memory (DRAM). In both cases, avoiding corruption of data stored in the memories is vital to proper operation of the computer. An error in even a single bit stored in memory may be sufficient to frustrate execution of a desired instruction by the CPU. Although various error checking mechanisms exist in the prior art, these mechanisms typically introduce undesirable overhead in terms of hardware and/or processing time. In addition, the complexity of these mechanisms may add to the overall complexity and cost of the memory system.

SUMMARY OF INVENTION

In general, in one aspect, a random access memory comprises a first memory bank, a second memory bank, an error checking circuit operatively connected to receive data read from the first memory bank, and a multiplexer operatively connected to input data read from both the first memory bank and the second memory bank, wherein input selection of the multiplexer is controlled by an output of the error checking circuit.

In accordance with one or more embodiments, the first memory bank and second memory bank may comprise static random access memory. The error checking circuit may comprise a parity checking circuit. The parity checking circuit may determine parity of the data read from the first memory bank is correct, the multiplexer may select the input from the first memory bank, and when the parity checking circuit determines parity of the data read from the first memory bank is incorrect, the multiplexer may select the input from the second data bank. The first memory bank, the second memory bank, the error checking circuit, and the multiplexer may be implemented on a single chip. The random access memory may comprise means for writing data simultaneously to the first memory bank and the second memory bank.

In general, in one aspect, a partitioned memory system comprises a first memory device, a second memory device, means for writing data to the first and second memory devices in parallel, means for error checking data read from the first memory device and outputting a result indicative thereof, selection means for selecting data read from the first memory device for output to a bus if the result from the error checking means indicates no error and for selecting data read from the second memory device for output to the bus if the result from the error checking means indicates an error.

In a accordance with one or more embodiments, the the first memory device and the second memory device may comprise static random access memory. The error checking means may comprise means for checking parity. The selection means may comprise a multiplexer. The first memory device, the second memory device, the error checking means, and the selection means may be implemented on a single chip.

In general, in one aspect, a method for reducing errors in a memory system comprises writing data into first and second memory banks of the memory system in parallel, reading data from a desired location of the first memory bank, checking the data read from the first memory bank for errors, if no errors are present, outputting the data read from the first memory bank to a bus, and if the data read from the first memory bank contains errors, outputting data read from a parallel location in the second memory bank to the bus.

In accordance with one or more embodiments, checking the data read from the first memory bank for errors may comprise checking the data for parity. The data read from the first memory bank may be cleared for parity on a byte-by-byte basis. Data from one of the first memory bank and second memory bank may be selected using a multiplexer.

In general, in one aspect, a partitioned static random access memory comprises a first static random access memory bank, a second static random access memory bank, the first and second static random access memory banks being configured such that data may be written to parallel locations therein, a parity checking circuit configured to check parity of data read from the first static random access memory bank and to output a result indicative thereof, and a multiplexer configured to receive data read from the parallel locations in the first and second static random access memory banks and to select one of said data depending upon the result output by the parity checking circuit.

Other aspects and advantages of the invention will be apparent from the following description and the appended claims.

DETAILED DESCRIPTION

Figure 1:
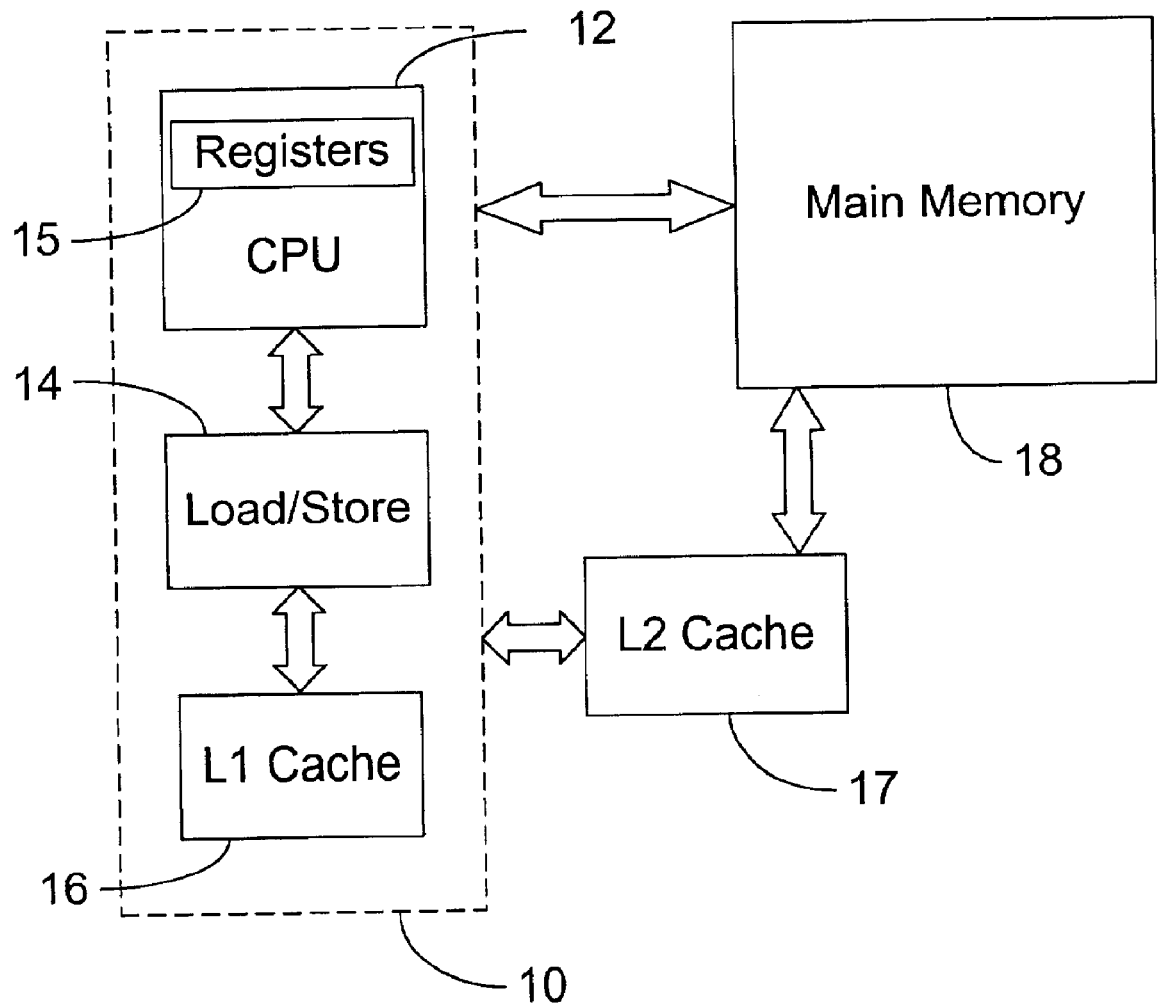
FIG. 1 is a schematic diagram of a prior art computer system.

Various embodiments of the invention will now be described with reference to the accompanying figures. Referring back to FIG. 1, level two cache such as L2 cache (17) shown may be, for example, a 16 Mbit×18 or 16 Mbit×36 SRAM. The static random access memory (SRAM) is a form of semiconductor memory based on flip-flops, which retains information so long as there is enough power to run the device. This is distinguished from a dynamic random access memory (DRAM), which stores information in integrated circuits containing capacitors. DRAMs are referred to as "dynamic" because capacitors lose their charge over time, thus necessitating logic to refresh or recharge the DRAM chip continuously. A DRAM is thus slower than a SRAM because it can not be read by the processor while it is being refreshed. However, the circuitry of a DRAM is more simple and thus can hold up to four times as much data.

The SRAM is typically used for cache memory due to its speed. However, a known drawback of SRAMs is their susceptibility to soft-error upsets due to alpha particles and cosmic rays. Such soft-error upsets may result in catastrophic system failures.

Figure 2:
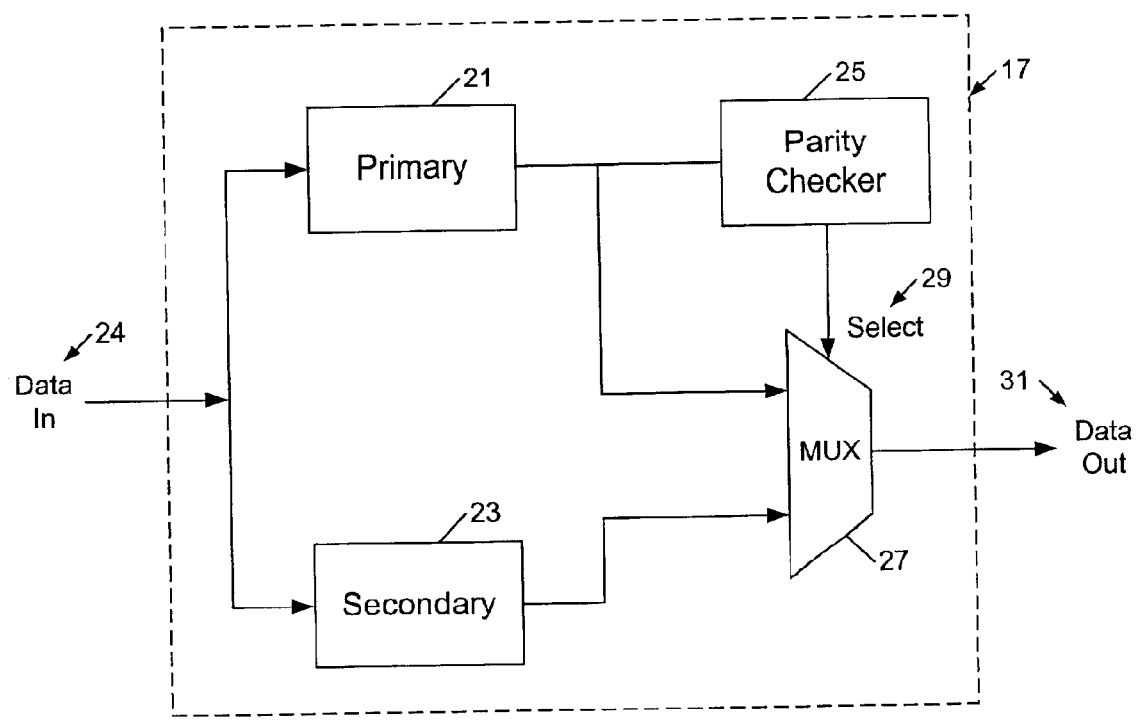
FIG. 2 is a schematic diagram of a partitioned random access memory in accordance with one embodiment of the invention.

Referring now to FIG. 2, an expanded view of level 2 cache (17) is shown wherein the memory has been partitioned into a primary bank (21) and secondary bank (23). The separation between every primary and secondary cell pair should be at least fifty microns. In addition, the primary and secondary banks should be configured so as to minimize the possibility of common-mode failures. The term "common-mode failures" refers to failures in redundant systems whereby multiple component failures having the same cause defeat the benefits of component duplication.

During a write operation, data are written simultaneously to both the primary and secondary banks via a bus (24). The written data includes an appropriate even or odd parity bit per datum, which may be a byte, word, or other appropriate division of data.

During a read operation, data are read in parallel from identical addresses of both the primary and secondary banks. Data from only the primary bank (21) are applied to a parity checker (25) that checks the read data for parity. Any known mechanism for checking parity may be employed, including even or odd parity. In addition, different and more complex methods of error detection may be employed without departing from the spirit and scope of the invention. The data read from primary bank (21) and secondary bank (23) are also applied to a multiplexer (MUX) (27). The output of parity checker (25) is applied to a select input (29) of the MUX (27). Thus, when a read operation occurs, the data read from primary bank (21) are first checked for parity on a byte-by-byte or word-by-word basis. If the parity is good, MUX (27) causes the data from the primary bank (21) to be output via bus (31). If, on the other hand, the parity of the data read from primary bank (21) is bad, parity checker (25) issues a signal to MUX (27) via select input (29) to cause the MUX to select the data read from secondary bank (23) for output on bus (31).

As noted above, although the embodiment of the invention described above employs a parity checker, any known method of error checking may be employed depending upon the acceptable limits of cost and complexity. Moreover, while in the above-described embodiment data read from primary bank (21) will be parity checked on a byte-by-byte or word-by-word basis, less rigorous parity checking is possible, again depending upon the desired results.

The embodiment of FIG. 2 has been shown and described in terms of application of the invention to level 2 cache. However, the invention is not limited thereto, and in fact can be used for any type of memory system, be it in cache or main memory. In addition, embodiments of the invention may be implemented using individual components for one or more of the primary bank (21), secondary bank (23), parity checker (25), and MUX (27). Alternatively, they may be incorporated into a single partitioned SRAM chip. Thus, the skilled artisan will appreciate that various modifications and applications of the invention are possible and appropriate within the spirit and scope of the invention.

The partitioned random access memory of the invention provides a simple and reliable mechanism by which soft-error susceptibility is virtually eliminated through the use of redundant storage and selection of correct data via error checking. The memory of the invention need not employ complex error algorithms, and is efficient in terms of speed, space, and cost.

While the invention has been described with respect to particular embodiments, the invention is not limited thereto, but is rather is limited only by the scope of the appended claims.

What is claimed is:

1. A random access memory, comprising:

a first memory bank;

a second memory bank;

an error checking circuit operatively connected to receive data read from only the first memory bank; and a multiplexer operatively connected to input data read from both the first memory bank and the second memory bank, wherein the error checking circuit is electrically disposed between the first memory bank and the multiplexer, and wherein input selection of the multiplexer is controlled by an output of the error checking circuit.

2. The random access memory of claim 1, wherein the first memory bank and second memory bank comprise static random access memory.

3. The random access memory of claim 1, wherein the error checking circuit comprises a parity checking circuit.

4. The random access memory of claim 1, wherein when the parity checking circuit determines parity of the data read from the first memory bank is correct, the multiplexer selects the input from the first memory bank, and when the parity checking circuit determines parity of the data read from the first memory bank is incorrect, the multiplexer selects the input from the second memory bank.

5. The random access memory of claim 1, wherein the first memory bank, the second memory bank, the error checking circuit, and the multiplexer are implemented on a single chip.

6. The random access memory of claim 1, further comprising means for writing data simultaneously to the first memory bank and the second memory bank.

7. A partitioned memory system, comprising:

a first memory device;

a second memory device;

means for writing data to the first and second memory devices in parallel;

means for error checking data read from only the first memory device and outputting a result indicative thereof; and selection means for selecting data read from the first memory device for output to a bus if the result from the error checking means indicates no error and for selecting data read from the second memory device for output to the bus if the result from the error checking means indicates an error, wherein the means for error checking is electrically disposed between the first memory device and the selection means.

8. The memory system of claim 7, wherein the first memory device and the second memory device comprise static random access memory.

9. The memory system of claim 7, wherein the error checking means comprises means for checking parity.

10. The memory system of claim 7, wherein the selection means comprises a multiplexer.

11. The memory system of claim 7, wherein the first memory device, the second memory device, the error checking means, and the selection means are implemented on a single chip.

12. A method for reducing errors in a memory system, comprising:
  writing data into first and second memory banks of the memory system in parallel;
  reading data from a desired location of the first memory bank;
  checking the data read from the first memory bank for errors;
  if no errors are present, outputting the data read from only the first memory bank to a bus; and
  if the data read from the first memory bank contains errors, outputting data read from a parallel location in the second memory bank to the bus,
  wherein checking the data occurs electrically between reading data from the desired location of the first memory bank and outputting data from one of the first memory bank and the second memory bank to the bus.

13. The method to claim 12, wherein checking the data read from the first memory bank for errors comprises checking the data for parity.

14. The method of claim 12, wherein the data read from the first memory bank is cleared for parity on a byte-by-byte basis.

15. The method of claim 12, wherein data from one of the first memory bank and second memory bank are selected using a multiplexer.

16. A partitioned static random access memory comprising:
  a first static random access memory bank;
  a second static random access memory bank, the first and second static random access memory banks being configured such that data may be written to parallel locations therein;
  a parity checking circuit configured to check parity of data read from only the first static random access memory bank and to output a result indicative thereof; and
  a multiplexer configured to receive data read from the parallel locations in the first and second static random access memory banks and to select one of said data depending upon the result output by the parity checking circuit, wherein the parity checking circuit is electrically disposed between the first static random access memory bank and the multiplexer.

* * * * *